(12) United States Patent
Abe et al.

(10) Patent No.: US 12,243,841 B2
(45) Date of Patent: Mar. 4, 2025

(54) ELECTRONIC COMPONENT EMBEDDED SUBSTRATE AND CIRCUIT MODULE USING THE SAME

(71) Applicant: TDK Corporation, Tokyo (JP)

(72) Inventors: Toshiyuki Abe, Tokyo (JP); Yoshihiro Suzuki, Tokyo (JP); Hironori Chiba, Tokyo (JP); Tetsuya Yazaki, Tokyo (JP); Hiroshige Ohkawa, Tokyo (JP)

(73) Assignee: TDK Corporation, Tokyo (JP)

( * ) Notice: Subject to any disclaimer, the term of this patent is extended or adjusted under 35 U.S.C. 154(b) by 209 days.

(21) Appl. No.: 17/618,666

(22) PCT Filed: Jun. 5, 2020

(86) PCT No.: PCT/JP2020/022236
§ 371 (c)(1),
(2) Date: Dec. 13, 2021

(87) PCT Pub. No.: WO2020/250815
PCT Pub. Date: Dec. 17, 2020

(65) Prior Publication Data
US 2022/0238474 A1    Jul. 28, 2022

(30) Foreign Application Priority Data
Jun. 14, 2019 (JP) ................................ 2019-110898

(51) Int. Cl.
*H01L 23/00* (2006.01)
*H01L 23/367* (2006.01)
(Continued)

(52) U.S. Cl.
CPC ............ *H01L 24/24* (2013.01); *H01L 23/367* (2013.01); *H01L 24/19* (2013.01); *H01L 24/20* (2013.01);
(Continued)

(58) Field of Classification Search
CPC . H01S 5/0233; H01S 5/02469; H05K 1/0201; H05K 1/0203; H05K 1/0204;
(Continued)

(56) References Cited

U.S. PATENT DOCUMENTS 4,596,604 A * 6/1986 Akiyama ............ H01L 21/8221
438/980
6,521,990 B2 * 2/2003 Roh ...................... H05K 1/0207
257/E23.101
(Continued)

FOREIGN PATENT DOCUMENTS

JP    10-316469 A    12/1998
JP    11-54939 A     2/1999
(Continued)

OTHER PUBLICATIONS

International Search Report issued in corresponding International Patent Application No. PCT/JP2020/022236, dated Sep. 8, 2020, with English translation.

*Primary Examiner* — Jacob R Crum
*Assistant Examiner* — Matthew Sinclair Muir
(74) *Attorney, Agent, or Firm* — Rimon P.C.

(57) ABSTRACT

To improve heat dissipation efficiency in an electronic component embedded substrate for mounting an electronic component of a type being prohibited from connecting to a ground pattern. An electronic component embedded substrate includes an electronic component and a heat transfer block which are embedded in insulating layers, a wiring pattern facing a surface of the heat transfer block, a wiring pattern facing another surface of the heat transfer block, a via conductor connecting the wiring pattern and the surface of the heat transfer block, and another via conductor connecting the wiring pattern and the another surface of the heat transfer block. The surfaces are insulated from each other. Even when an electronic component of a type having large (Continued)

heat generation and being prohibited from connecting to a ground pattern is mounted, the wiring pattern functioning as a heat dissipation pattern is connected to a ground pattern on a motherboard.

20 Claims, 21 Drawing Sheets

(51) Int. Cl.
    *H01L 25/16*     (2023.01)
    *H01S 5/0233*     (2021.01)
    *H01S 5/024*     (2006.01)

(52) U.S. Cl.
    CPC .............. *H01L 24/82* (2013.01); *H01L 25/16* (2013.01); *H01S 5/0233* (2021.01); *H01S 5/02469* (2013.01); *H01L 2224/19* (2013.01); *H01L 2224/211* (2013.01); *H01L 2224/24011* (2013.01); *H01L 2224/24137* (2013.01); *H01L 2224/24155* (2013.01); *H01L 2224/24175* (2013.01); *H01L 2224/244* (2013.01); *H01L 2224/82106* (2013.01)

(58) Field of Classification Search
    CPC .... H05K 1/0206; H05K 1/0207; H05K 1/021; H05K 1/0271
    See application file for complete search history.

(56) References Cited

U.S. PATENT DOCUMENTS

| | | | | |
|---|---|---|---|---|
| 7,405,102 | B2* | 7/2008 | Lee | H01L 25/50 |
| | | | | 257/E21.705 |
| 8,415,780 | B2* | 4/2013 | Sun | H01L 21/486 |
| | | | | 257/676 |
| 9,418,930 | B2* | 8/2016 | Stahr | H01L 23/367 |
| 9,832,856 | B2* | 11/2017 | Min | H05K 1/0204 |
| 10,297,517 | B2* | 5/2019 | Cheng | H01L 23/49822 |
| 2006/0033207 | A1* | 2/2006 | Nakamura | H05K 1/0243 |
| | | | | 257/E21.511 |
| 2008/0000874 | A1* | 1/2008 | Nakano | H01L 23/49838 |
| | | | | 216/13 |
| 2008/0079146 | A1* | 4/2008 | Hattori | H05K 1/0206 |
| | | | | 257/E23.102 |
| 2016/0037620 | A1* | 2/2016 | Kang | H01L 23/3677 |
| | | | | 361/711 |
| 2016/0302298 | A1 | 10/2016 | Min et al. | |
| 2017/0141744 | A1* | 5/2017 | Kim | H01L 23/49827 |
| 2019/0267307 | A1* | 8/2019 | Lin | H01L 23/3737 |
| 2020/0395731 | A1* | 12/2020 | Vethake | H01S 5/02423 |
| 2021/0267043 | A1* | 8/2021 | Yoo | H05K 1/0206 |

FOREIGN PATENT DOCUMENTS

| | | |
|---|---|---|
| JP | 2016-201532 A | 12/2016 |
| JP | 2019-046954 A | 3/2019 |
| WO | 2012/050122 A1 | 4/2012 |
| WO | 2016/063694 A1 | 4/2016 |

* cited by examiner

ELECTRONIC COMPONENT EMBEDDED SUBSTRATE AND CIRCUIT MODULE USING THE SAME

CROSS REFERENCE

This application is the U.S. National Phase under 35 U.S.C. § 371 of International Application No. PCT/JP2020/022236, filed on Jun. 5, 2020, which claims the benefit of Japanese Application No. 2019-110898, filed on Jun. 14, 2019, the entire contents of each are hereby incorporated by reference.

TECHNICAL FIELD

The present invention relates to an electronic component embedded substrate and a circuit module using the same and, more particularly, to an electronic component embedded substrate for mounting an electronic component having large heat generation, such as a laser diode or a power supply inductor, and a circuit module using such an electronic component embedded substrate.

BACKGROUND ART

When an electronic component having large heat generation is mounted on the front surface of a multilayer substrate, the multilayer substrate may sometimes be provided with a heat dissipation path so as to dissipate heat toward the back surface side thereof. For example, Patent Document 1 proposes a multilayer substrate having a structure in which a metal block is embedded in a position overlapping in a plan view an electronic component having large heat generation with the front surface of the thus embedded metal block and the electronic component connected through a plurality of via conductors and with the back surface of the metal block and a heat dissipation pattern provided on the back surface of the multilayer substrate connected through another plurality of via conductors. The heat dissipation pattern provided on the back surface of the multilayer substrate is connected to a heat dissipation path on a motherboard through a solder or the like. The heat dissipation path on the motherboard is typically a ground pattern. This allows heat generated from the electronic component to be dissipated to the motherboard through the metal block, so that high heat dissipation efficiency can be achieved even for an electronic component having large heat generation.

CITATION LIST

Patent Document

[Patent Document 1] JP 2019-046954A

SUMMARY OF THE INVENTION

Problem to be Solved by the Invention

However, when an electronic component of a type not only having large heat generation but also being prohibited from connecting to the ground pattern, such as a laser diode or a power supply inductor, is used, the structure described in Patent Document 1 cannot be employed.

It is therefore an object of the present invention to improve heat dissipation efficiency in an electronic component embedded substrate for mounting an electronic component of a type having large heat generation and being prohibited from connecting to a ground pattern and a circuit module using such an electronic component embedded substrate.

Means for Solving the Problem

An electronic component embedded substrate according to the present invention has: a substrate including a plurality of wiring layers including at least first and second wiring layers and a plurality of insulating layers including at least a first insulating layer positioned between the first and second wiring layers, the plurality of wiring layers and the plurality of insulating layers being alternately stacked; a first electronic component and a heat transfer block which are embedded in the first insulating layer; a first wiring pattern positioned in the first wiring layer and facing one surface of the heat transfer block; a second wiring pattern positioned in the second wiring layer and facing the other surface of the heat transfer block; a first via conductor connecting the first wiring pattern and the one surface of the heat transfer block; and a second via conductor connecting the second wiring pattern and the other surface of the heat transfer block. The first wiring pattern is connected to the first electronic component and is positioned in an electronic component mounting area for mounting a second electronic component. The one surface and the other surface of the heat transfer block are insulated from each other, and whereby the first and second wiring patterns are insulated from each other.

According to the present invention, the one surface and the other surface of the heat transfer block are insulated from each other, so that even when an electronic component of a type having large heat generation and being prohibited from connecting to a ground pattern is mounted as the second electronic component, the second wiring pattern functioning as a heat dissipation pattern can be connected to a ground pattern on a motherboard. This can achieve high heat dissipation performance.

In the present invention, the heat transfer block may be formed of an SOI (Silicon On Insulator) chip, may be composed of a metal body part and an insulating film formed on one or both surface of the metal body part, or may be made of a ceramic material. That is, the heat transfer block is not particularly limited in terms of material and structure as long as one and the other surfaces thereof are insulated from each other and it has a high heat conductivity.

A circuit module according to the present invention includes the above electronic component embedded substrate and a second electronic component mounted in the electronic component mounting area. The first and second electronic components are connected to each other through the first wiring pattern.

According to the present invention, the first and second wiring patterns are insulated from each other, thus allowing signals to be exchanged between the first and second electronic components through the first wiring pattern.

In the present invention, the second electronic component may be a laser diode or a power supply inductor. Although the laser diode and power supply inductor are each an electronic component of a type having large heat generation and being prohibited from connecting to a ground pattern, such an electronic component still can efficiently dissipate heat through the electronic component embedded substrate.

Advantageous Effects of the Invention

As described above, according to the present invention, heat dissipation efficiency can be improved in an electronic component embedded substrate for mounting an electronic component of a type having large heat generation and being prohibited from connecting to a ground pattern and a circuit module using such an electronic component embedded substrate.

MODE FOR CARRYING OUT THE INVENTION

Preferred embodiments of the present invention will be explained below in detail with reference to the accompanying drawings.

Figure 1:
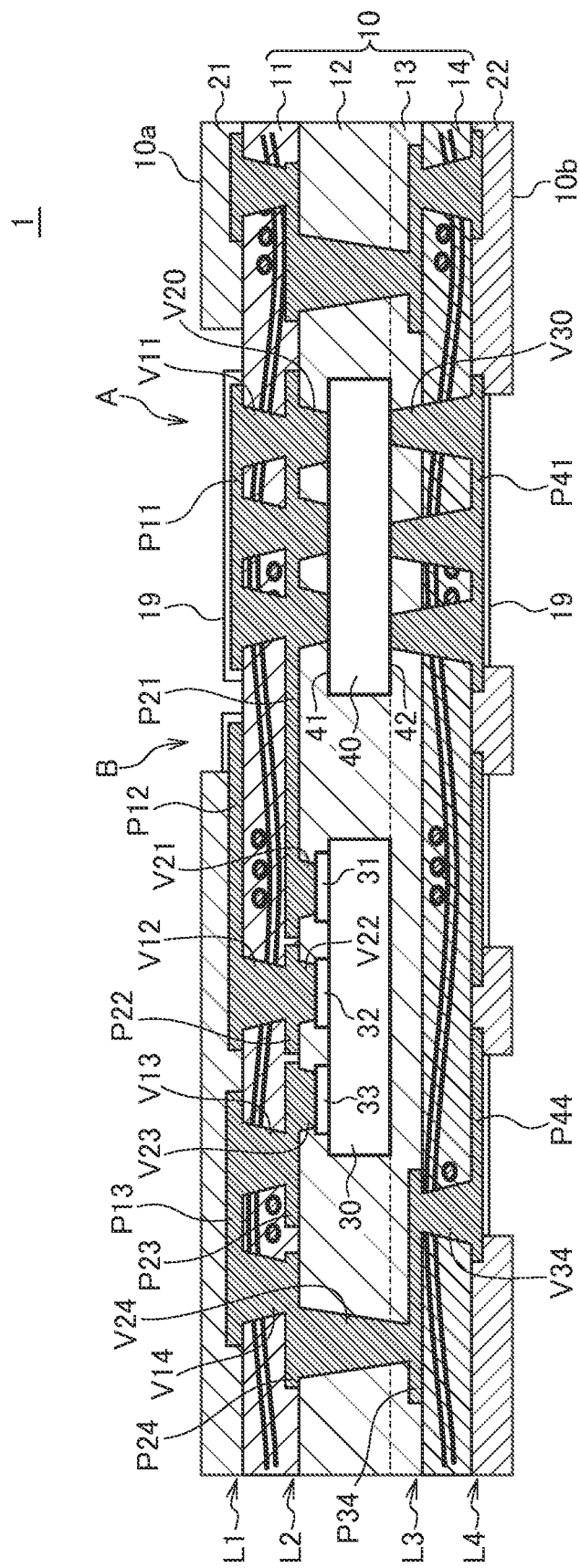
FIG. 1 is a schematic cross-sectional view for explaining the structure of an electronic component embedded substrate 1 according to a preferred embodiment of the present invention.

FIG. 1 is a schematic cross-sectional view for explaining the structure of an electronic component embedded substrate 1 according to a preferred embodiment of the present invention.

As illustrated in FIG. 1, the electronic component embedded substrate 1 according to the present embodiment includes a substrate 10, an electronic component 30, and a heat transfer block 40. The electronic component 30 and heat transfer block 40 are embedded in the substrate 10. An electronic component mounting area A is provided on the side of an upper surface 10a of the substrate 10, and the electronic component 30 controls an electronic component mounted in the electronic component mounting area A. The electronic component 30 has a pair of signal terminals 31 and 32, a power supply terminal 33, and the like.

The substrate 10 has a structure in which four insulating layers 11 to 14 are stacked one on another, and wiring layers L1 to L4 are provided on the surfaces of the insulating layers 11 to 14, respectively. Although not particularly limited, the uppermost insulating layer 11 and the lowermost insulating layer 14 may each be a core layer obtained by impregnating a core material such as glass fiber with a resin material such as glass epoxy. On the other hand, the insulating layers 12 and 13 may each be made of a resin material not containing a core material such as glass cloth. Particularly, the insulating layers 11 and 14 are preferably smaller in thermal expansion coefficient than the insulating layers 12 and 13.

The wiring layer L1 has wiring patterns P11 to P13, the wiring layer L2 has wiring patterns P21 to P24, the wiring layer L3 has a wiring pattern P34, and the wiring layer L4 has wiring patterns P41 and P44. The wiring layer L1 is positioned on the upper surface 10a side of the substrate 10 and is partly covered with a solder resist 21. The entire surface of the wiring pattern P11 and a part of the wiring pattern P12 are each not covered with the solder resist 21 but with an ENEPIG coating 19. The wiring pattern P11 not covered with the solder resist 21 is positioned in the electronic component mounting area A. A part of the wiring pattern P12 that is not covered with the solder resist 21 constitutes a bonding pad B. The wiring layer L4 is positioned on the side of a back surface 10b of the substrate 10 and is partly covered with a solder resist 22. A part of each of the wiring patterns P41 and P44 is not covered with the solder resist 22 but with the ENEPIG coating 19.

The heat transfer block 40 is a chip component constituting a heat dissipation path for dissipating heat from the upper surface 10a side toward the back surface 10b side and has a surface 41 facing the upper surface 10a side and a surface 42 facing the back surface 10b side. The surfaces 41 and 42 of the heat transfer block 40 are insulated from each other. The heat transfer block 40 is not particularly limited in terms of material and structure as long as it has a sufficiently higher heat conductivity than those of the insulating layers 12 and 13, and the surfaces 41 and 42 are insulated from each other.

Figure 2:
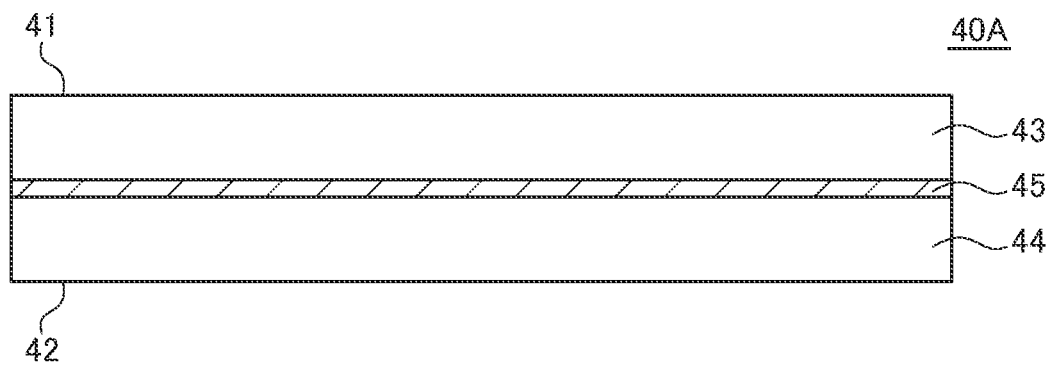
FIG. 2 is a schematic diagram for explaining a structure of a heat transfer block 40A according to a first example.

For example, it is possible to employ a heat transfer block 40A formed of an SOI (Silicon On Insulator) chip as illustrated in FIG. 2 as a first example. The SOI chip has a structure in which an insulating film 45 made of silicon oxide is interposed between a silicon substrate 43 constituting the surface 41 and a silicon substrate 44 constituting the surface 42. In this case, since the heat conductivity of the silicon is high, it is possible to increase the heat conductivity of the heat transfer block as a whole by sufficiently reducing the film thickness of the insulating film 45 while insulating the surfaces 41 and 42 from each other.

Figure 3:
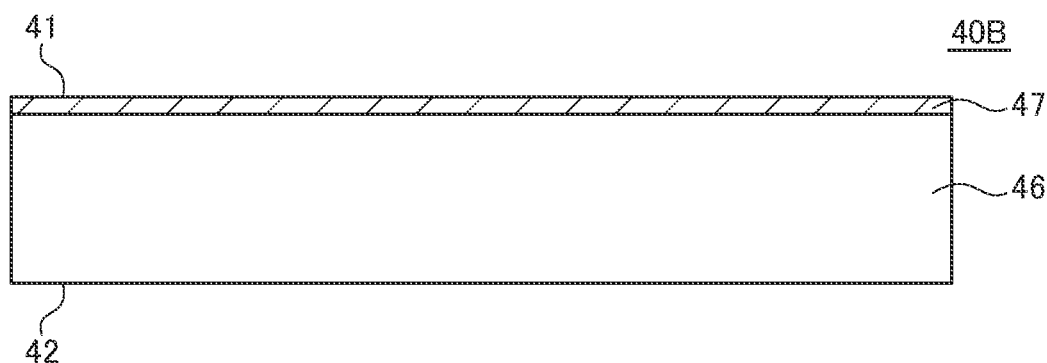
FIG. 3 is a schematic diagram for explaining a structure of a heat transfer block 40B according to a second example.
Figure 4:
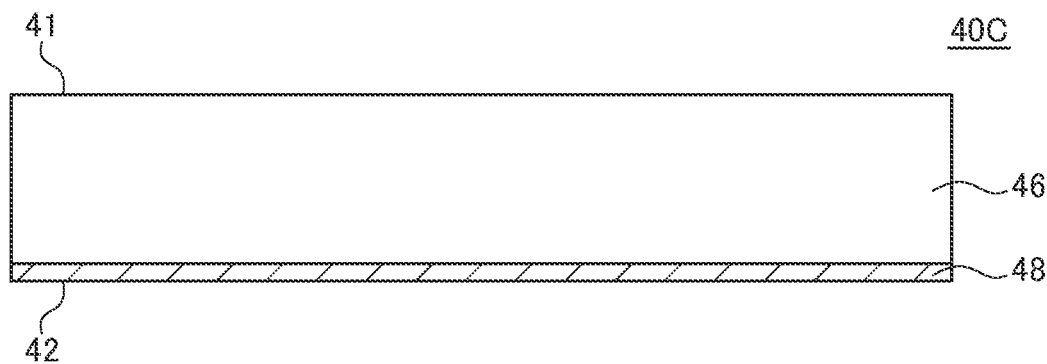
FIG. 4 is a schematic diagram for explaining a structure of a heat transfer block 40C according to a third example.
Figure 5:
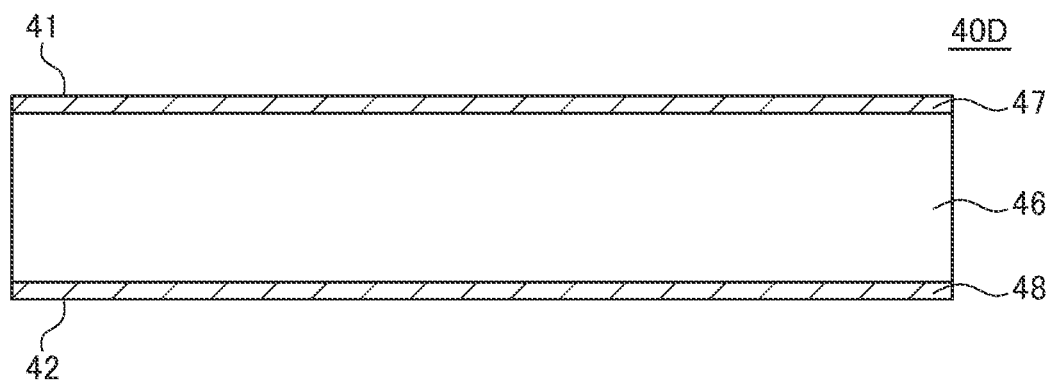
FIG. 5 is a schematic diagram for explaining a structure of a heat transfer block 40D according to a fourth example.

Alternatively, it is possible to employ a heat transfer block 40B having a structure in which an insulating film 47 is formed on the upper surface of a main body part 46 made of metal such as copper (Cu) as illustrated in FIG. 3 as a second example, a heat transfer block 40C having a structure in which an insulating film 48 is formed on the lower surface of a main body part 46 made of metal such as copper (Cu) as illustrated in FIG. 4 as a third example, and a heat transfer block 40D having a structure in which insulating films 47 and 48 are formed respectively on the upper and lower surfaces of a main body part 46 made of metal such as copper (Cu) as illustrated in FIG. 5 as a fourth example. In these cases, since the heat conductivity of the main body part 46 is high, it is possible to increase the heat conductivity of the heat transfer block as a whole by sufficiently reducing the film thicknesses of the insulating films 47 and 48 while insulating the surfaces 41 and 42 from each other. The insulating films 47 and 48 can be made using silicon nitride (SiN) and deposited by a sputtering method or the like.

Figure 6:
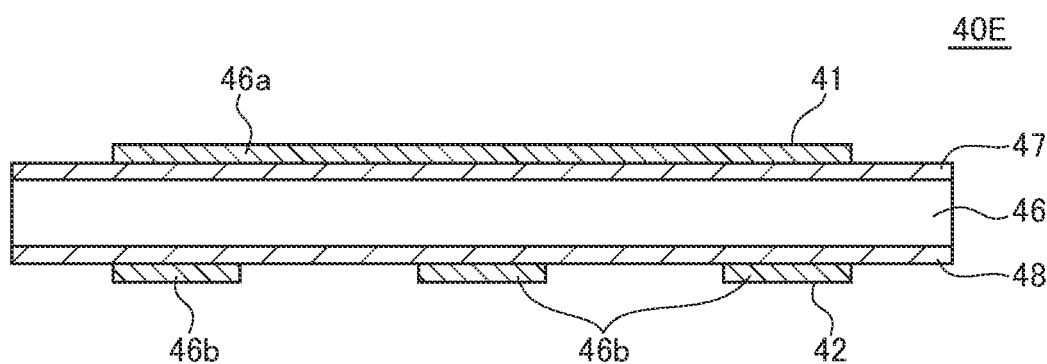
FIG. 6 is a schematic diagram for explaining a structure of a heat transfer block 40E according to a fifth example.
Figure 7:
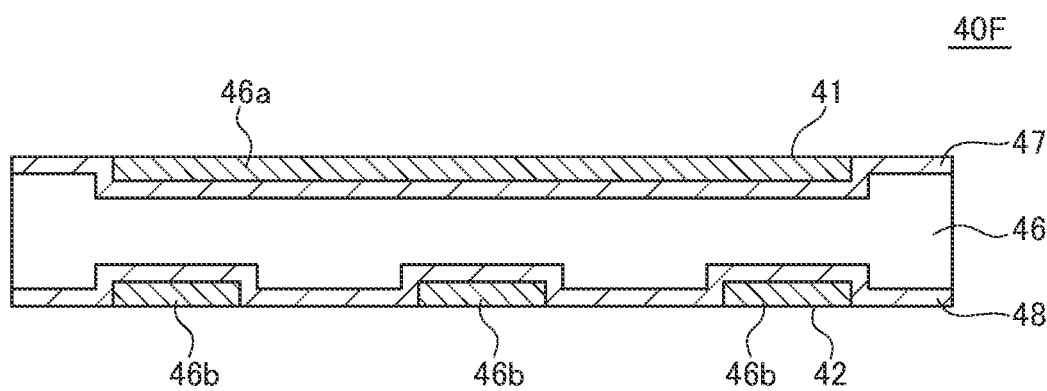
FIG. 7 is a schematic diagram for explaining a structure of a heat transfer block 40F according to a sixth example.

Besides, it is possible to employ a heat transfer block 40E having a structure in which addition parts 46a and 46b are added to the heat transfer block 40D of FIG. 5 as illustrated in FIG. 6 as a fifth example. The addition parts 46a and 46b are provided on the surfaces of the insulating films 47 and 48, respectively, and are each made of metal such as copper (Cu) like the main body part 46. Providing such addition parts 46a and 46b makes the heat conductivity higher than that of the heat transfer block 40D of FIG. 5. Further, it is possible to employ a heat transfer block 40F having a structure in which the surfaces of the main body part 46 having recesses and protrusions are covered with the insulating films 47 and 48, respectively, and the addition parts 46a and 46b are embedded in the recesses as illustrated in FIG. 7 as a sixth example. Since the surfaces 41 and 42 of the heat transfer block 40F of FIG. 7 each have almost a flat shape, voids are unlikely to occur when the heat transfer block 40F is embedded in the insulating layers 12 and 13. In the examples of FIGS. 6 and 7, the addition parts 46a and 46b constitute parts of the surfaces 41 and 42, respectively. The via conductors V20 and V30 illustrated in FIG. 1 are preferably formed so as to contact the addition parts 46a and 46b, respectively.

Figure 8A:
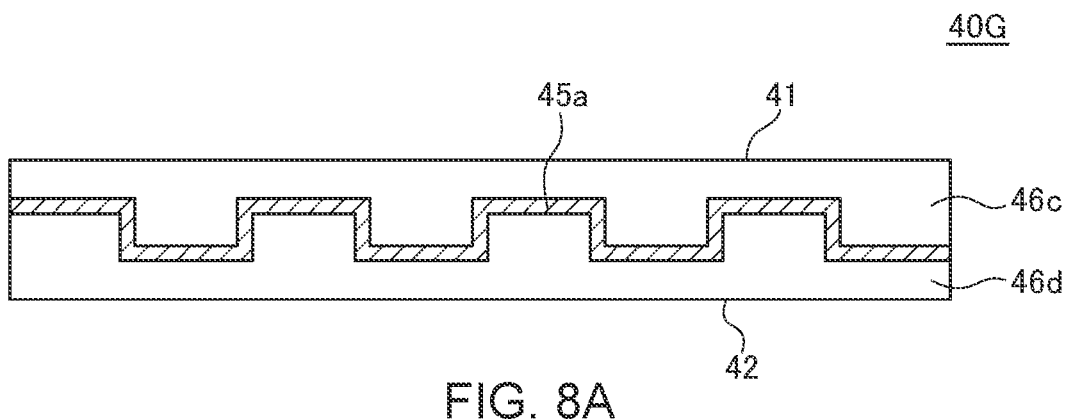
FIG. 8 is a schematic diagram for explaining a structure of a heat transfer block 40G according to a seventh example.
Figure 8B:
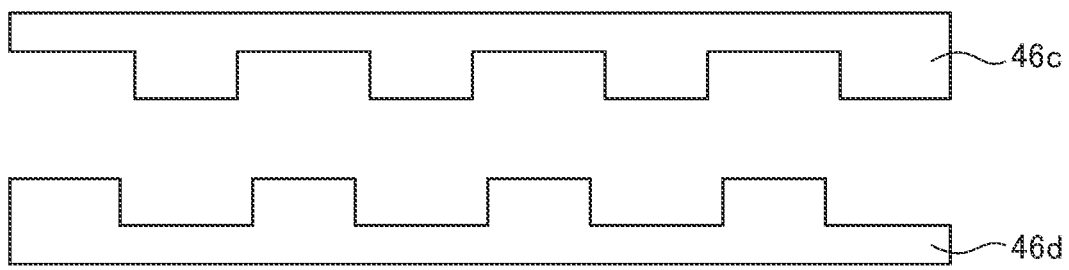

Further, it is possible to employ a heat transfer block 40G having a structure in which two main body parts 46c and 46d, one surface of each of which has a flat shape and the other surface of each of which has recesses and protrusions, are fitted to each other through an insulating film 45a as illustrated in FIG. 8A as a seventh example. The heat transfer block 40G having such a structure can be fabricated by preparing the main body parts 46c and 46d illustrated in FIG. 8B, forming the insulating film 45a on one or both of the recess/protrusion surfaces of the main body parts 46c and 46d, and bonding the main body parts 46c and 46d such that the recesses and projections of one main body part mesh with those of the other main body part.

Figure 9:
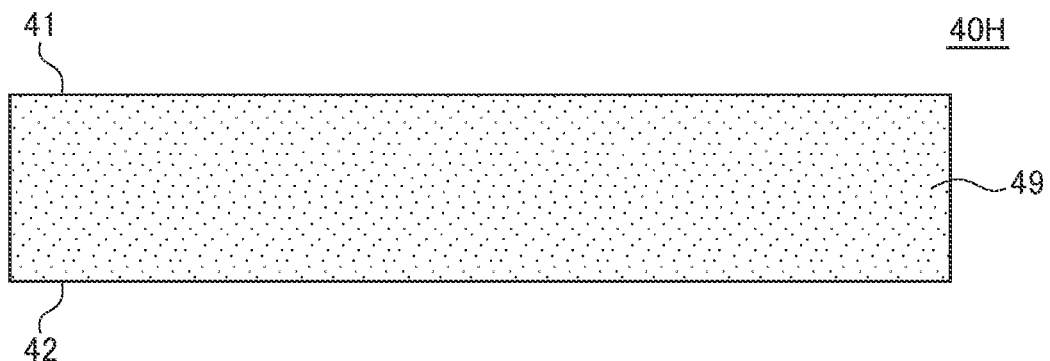
FIG. 9 is a schematic diagram for explaining a structure of a heat transfer block 40H according to an eighth example.

Further, it is possible to employ a heat transfer block 40H made of a ceramic 49 as illustrated in FIG. 9 as an eighth example. As the ceramic 49, such a material having an insulating property and a high heat conductivity as aluminum nitride (AlN) and silicon nitride (SiN) may be used. Using such a material allows the surfaces 41 and 42 to be insulated from each other without the need to form the insulating film.

Referring back to FIG. 1, the wiring layers L1 and L2 are connected through a plurality of via conductors penetrating the insulating layer 11. For example, the wiring patterns P11 and P21 are connected through a via conductor V11, the wiring patterns P12 and P22 are connected through a via conductor V12, the wiring patterns P13 and P23 are connected through a via conductor V13, and the wiring patterns P13 and P24 are connected through a via conductor V14.

The wiring layer L2, wiring layer L3, electronic component 30, and heat transfer block 40 are connected to one another through a plurality of via conductors. For example, the wiring pattern P21 and the surface 41 of the heat transfer block 40 are connected through a via conductor V20, the wiring pattern P21 and the signal terminal 31 of the electronic component 30 are connected through a via conductor V21, the wiring pattern P22 and the signal terminal 32 of the electronic component 30 are connected through a via conductor V22, the wiring pattern P23 and the power supply terminal 33 of the electronic component 30 are connected through a via conductor V23, and the wiring patterns P24 and P34 are connected through a via conductor V24 penetrating the insulating layers 12 and 13.

The wiring layer L4, wiring layer L3, and heat transfer block 40 are connected to one another through a plurality of via conductors. For example, the wiring pattern P41 and the surface 42 of the heat transfer block 40 are connected through a via conductor V30, and the wiring patterns P44 and P34 are connected through a via conductor V34 penetrating the insulating layer 14.

Figure 10:
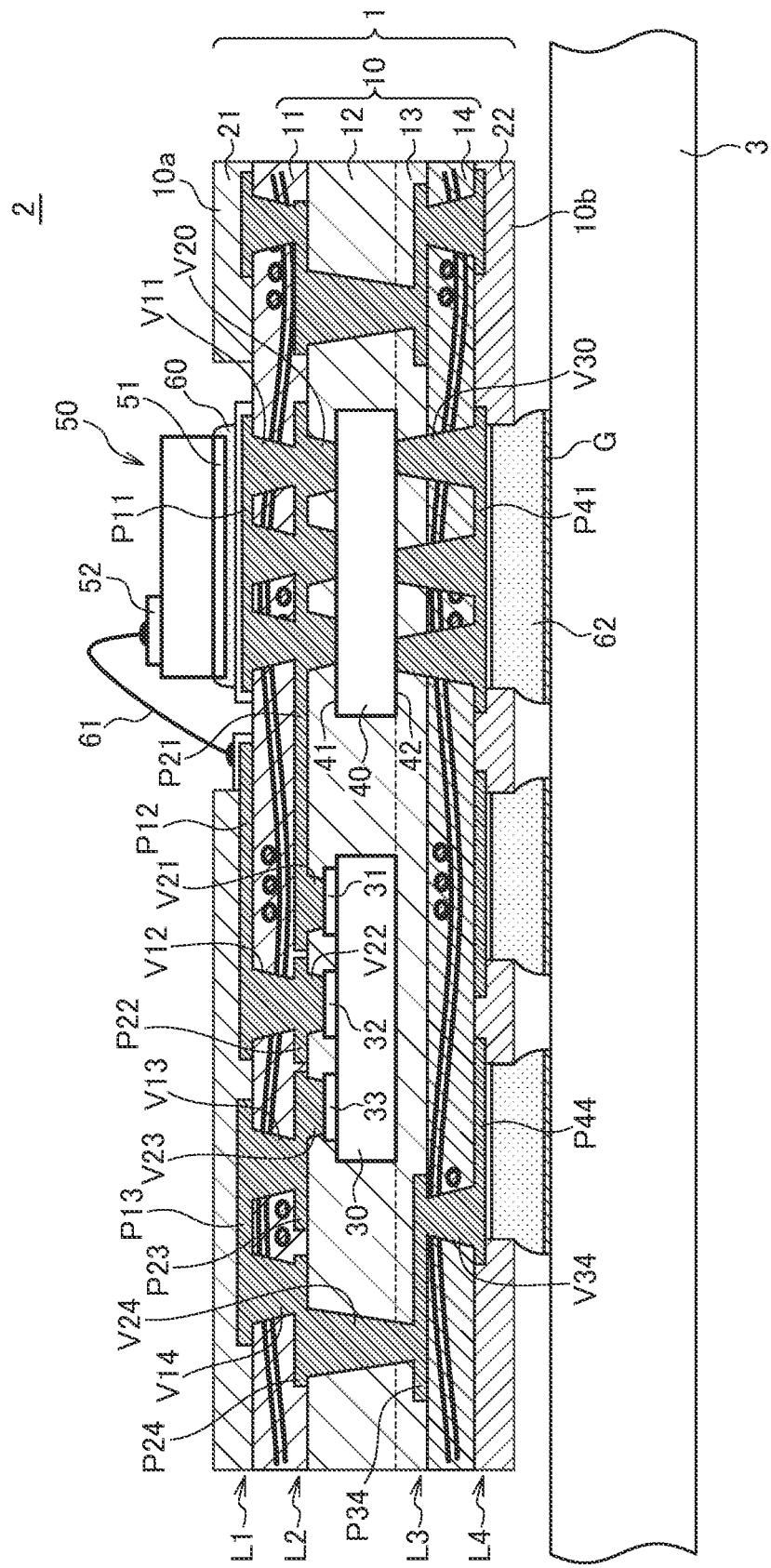
FIG. 10 is a schematic cross-sectional view for explaining the structure of a circuit module 2 using the electronic component embedded substrate 1.

FIG. 10 is a schematic cross-sectional view for explaining the structure of a circuit module 2 using the electronic component embedded substrate 1.

As illustrated in FIG. 10, the circuit module 2 includes the electronic component embedded substrate 1 illustrated in FIG. 1 and an electronic component 50 mounted in the electronic component mounting area A of the electronic component embedded substrate 1. Although not particularly limited, the electronic component 50 is, for example, a laser diode. The laser diode has large heat generation and is prohibited from connecting to the ground pattern because of its characteristics, so that it cannot dissipate its heat by connecting to the ground pattern, unlike common electronic components. Another example of the same type of electronic component includes a power supply inductor.

The electronic component 50 illustrated in FIG. 10 has a two-terminal configuration including signal terminals 51 and 52. The signal terminal 51 is formed on the back surface of the electronic component 50 and connected to the wiring pattern P11 positioned in the electronic component mounting area A through a solder 60. The signal terminal 51 is formed over the entire back surface of the electronic component 50, so that heat generated by the operation of the electronic component 50 is efficiently transmitted to the wiring pattern P11. The signal terminal 52 is formed on the upper surface of the electronic component 50 and connected to the bonding pad B constituted by the wiring pattern P12 through a bonding wire 61. When a laser diode is mounted as the electronic component 50, laser light is generated by a signal applied to the signal terminals 51 and 52. The signal terminal 51 is connected to the signal terminal 31 of the electronic component 30 through the solder 60, wiring pattern P11, via conductor V11, wiring pattern P21, and via conductor V21. The signal terminal 52 is connected to the signal terminal 32 of the electronic component 30 through the bonding wire 61, wiring pattern P12, via conductor V12, wiring pattern P22, and via conductor V22.

Heat transmitted from the electronic component 50 to the wiring pattern P11 is transmitted to the heat transfer block 40 through the plurality of via conductors V11, the wiring pattern P21, and the plurality of via conductors V20. The heat thus transmitted to the heat transfer block is then transmitted to the wiring pattern P41 functioning as a heat dissipation pattern through the plurality of via conductors V30. In actual use, the wiring pattern P41 is connected to a ground pattern G of a motherboard 3 through a solder 62. Thus, the heat generated by the operation of the electronic component 50 is efficiently dissipated to the motherboard 3 through the heat transfer block 40.

In the present embodiment, since the surfaces 41 and 42 of the heat transfer block 40 are insulated from each other, insulation between the via conductors V20 and V30 can be ensured even though they both contact the heat transfer block 40. This allows the wiring patterns P11 and P41 to serve as a signal line and a ground pattern, respectively. In addition, in the present embodiment, the heat transfer block 40 is embedded in the same layer as the electronic component 30, so that there is no need to increase the number of layers for the purpose of embedding the heat transfer block 40.

The following describes a manufacturing method for the electronic component embedded substrate 1 according to the present embodiment.

FIGS. 11 to 25 are process views for explaining the manufacturing method for the electronic component embedded substrate 1 according to the present embodiment.

Figure 11:
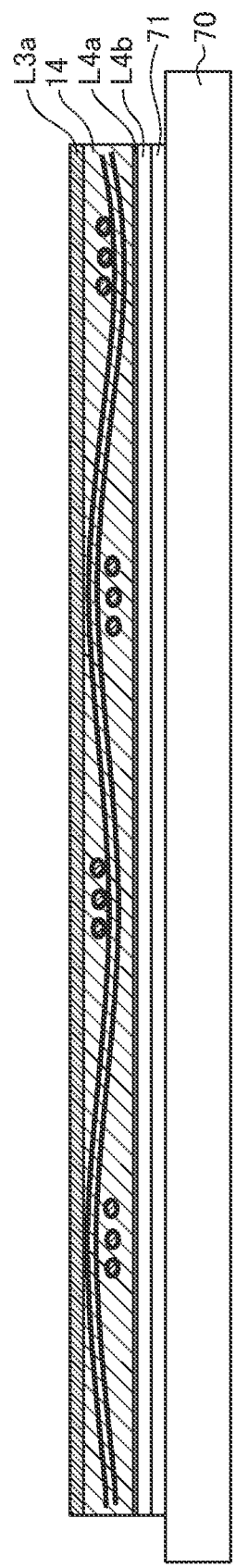
FIG. 11 is a process view for explaining the manufacturing method for the electronic component embedded substrate 1.

As illustrated in FIG. 11, a base material (work board) composed of the insulating layer 14 containing a core material such as glass fiber, a metal film L3a formed on one surface of the insulating layer 14, and a laminated structure of metal films L4a and L4b formed on the other surface of the insulating layer 14 is prepared and bonded to a support member 70 made of stainless steel or the like through a release layer 71.

Figure 12:
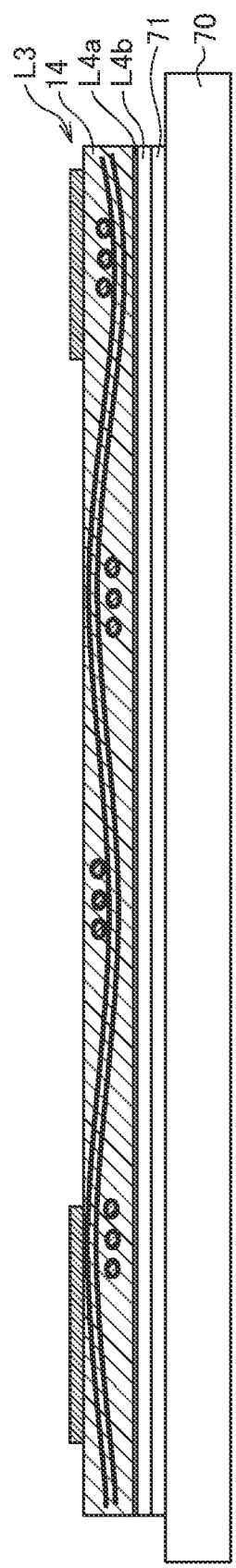
FIG. 12 is a process view for explaining the manufacturing method for the electronic component embedded substrate 1.
Figure 13:
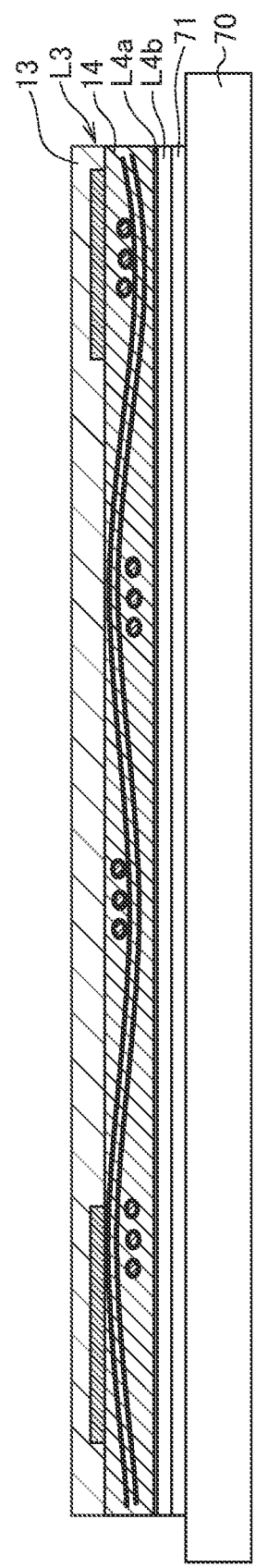
FIG. 13 is a process view for explaining the manufacturing method for the electronic component embedded substrate 1.

Then, as illustrated in FIG. 12, the metal film L3a is patterned using a photolithography method to form the wiring layer L3. Then, as illustrated in FIG. 13, for example, an uncured (B stage) resin sheet is laminated by vacuum pressure bonding or the like on the surface of the insulating layer 14 so as to embed therein the wiring layer L3 to thereby form the insulating layer 13.

Figure 14:
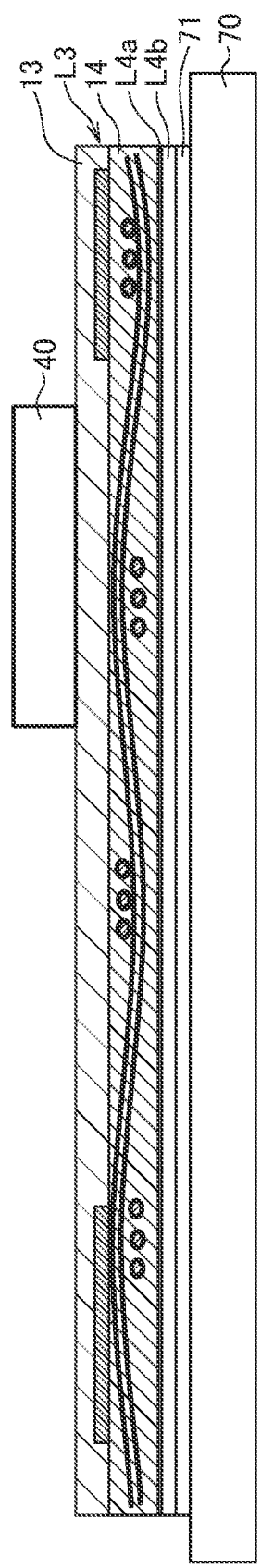
FIG. 14 is a process view for explaining the manufacturing method for the electronic component embedded substrate 1.
Figure 15:
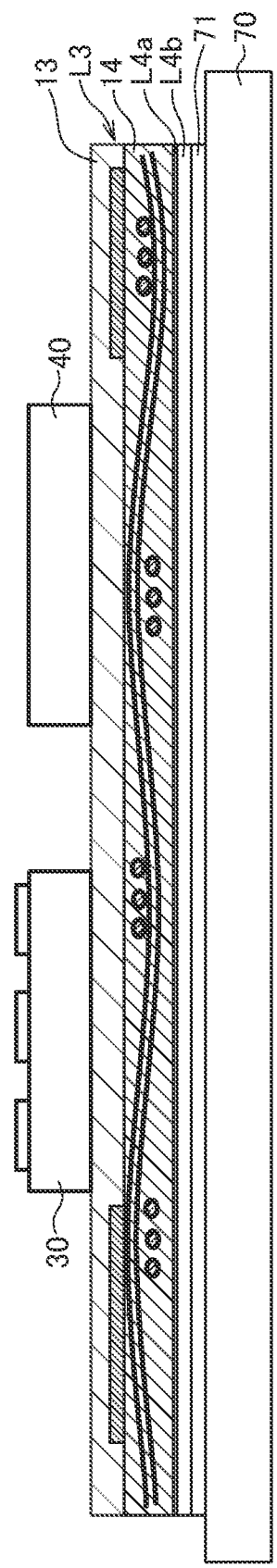
FIG. 15 is a process view for explaining the manufacturing method for the electronic component embedded substrate 1.

Subsequently, as illustrated in FIG. 14, the heat transfer block 40 is placed on the surface of the insulating layer 13, and then the electronic component 30 is placed on the surface of the insulating layer 13 as illustrated in FIG. 15. The electronic component 30 is, for example, a bare chip semiconductor IC and is face-up mounted such that the terminal formation surface faces upward. The order of placing the heat transfer block 40 and electronic component 30 may be reversed; however, by placing the heat transfer block 40 first, contacting between the terminal formation surface of the electronic component 30 and the heat transfer block 40 can be prevented.

Figure 16:
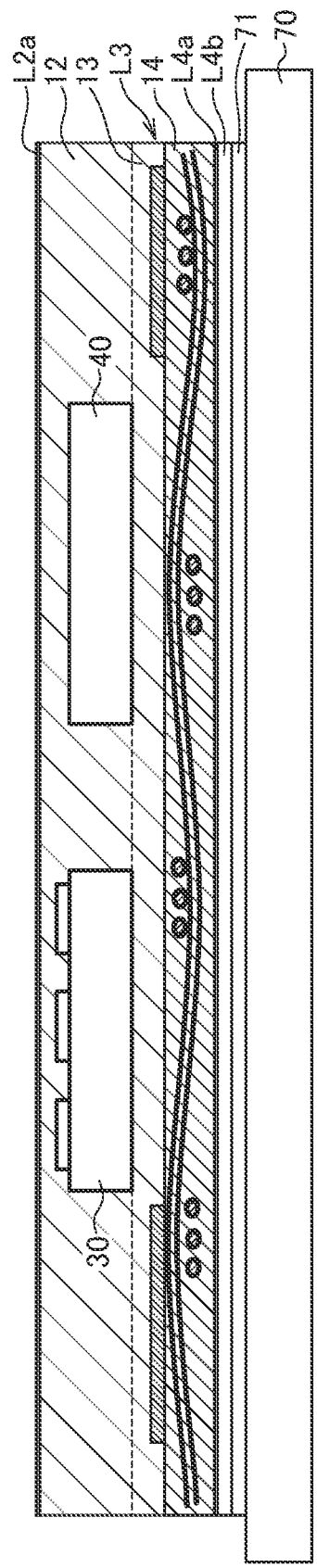
FIG. 16 is a process view for explaining the manufacturing method for the electronic component embedded substrate 1.

Then, as illustrated in FIG. 16, the insulating layer 12 and a metal film L2a are formed so as to cover the electronic component 30 and heat transfer block 40. Preferably, the insulating layer 12 is formed as follows: after application of an uncured or semi-cured thermosetting resin, the resin (when it is uncured resin) is semi-cured by heating, and then the semi-cured resin and metal film L2a are pressed together by a pressing means to obtain a cured insulating layer 12. The insulating layer 12 is preferably a resin sheet which does not contain fiber that would hinder the electronic component 30 and heat transfer block 40 from being embedded.

Figure 17:
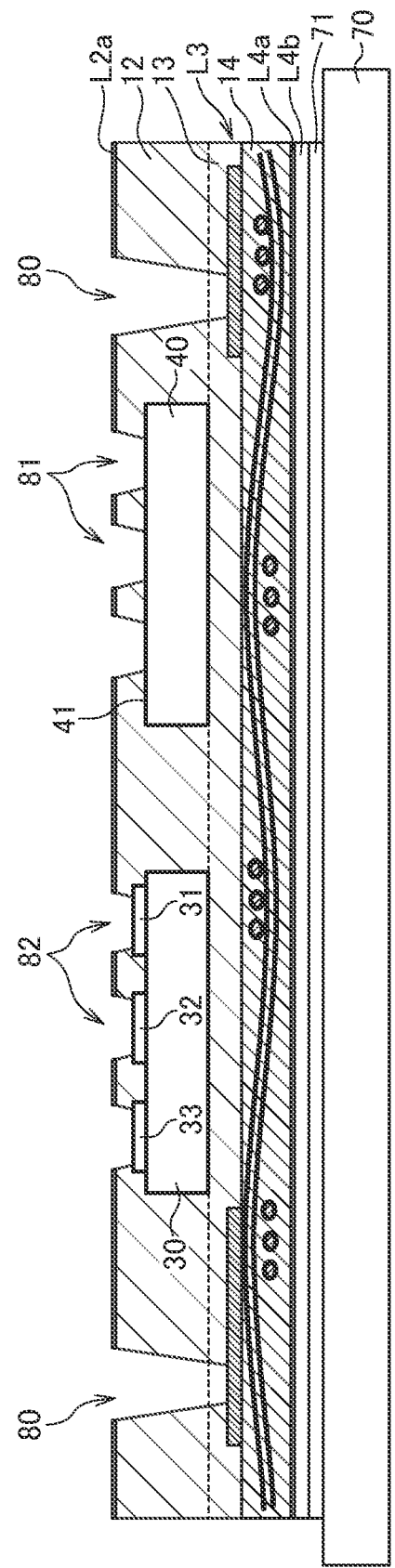
FIG. 17 is a process view for explaining the manufacturing method for the electronic component embedded substrate 1.

Then, as illustrated in FIG. 17, a part of the metal film L2a is etching-removed by using a known method such as a photolithography method, and then known blasting or laser processing is applied to a predetermined position where the metal film L2a is removed to form via holes 80 to 82. The via hole 80 penetrates the insulating layers 12 and 13 and exposes the wiring layer L3 at its bottom. The via hole 81 exposes the surface 41 of the heat transfer block 40, and the via hole 82 exposes the signal terminals 31 and 32 and power supply terminal 33 of the electronic component 30.

Figure 18:
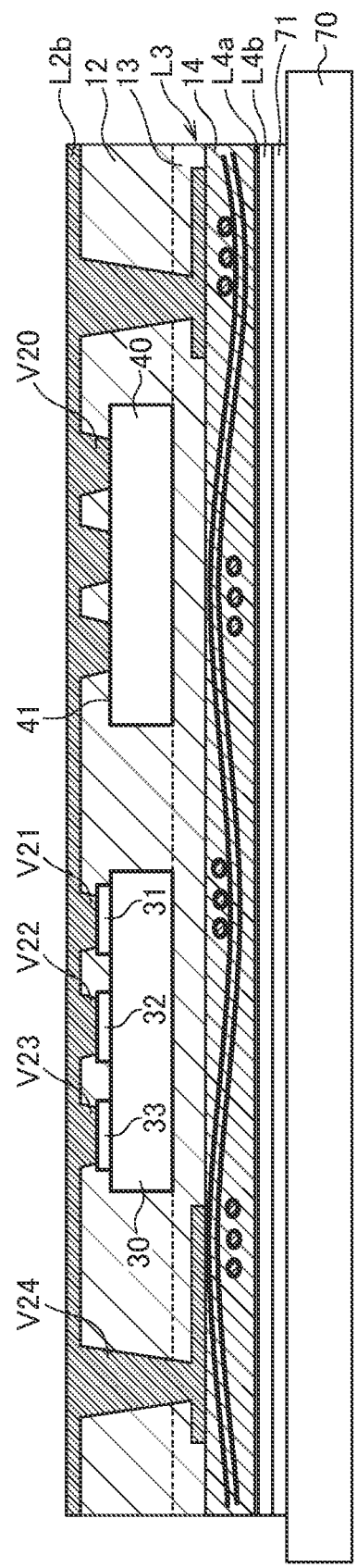
FIG. 18 is a process view for explaining the manufacturing method for the electronic component embedded substrate 1.
Figure 19:
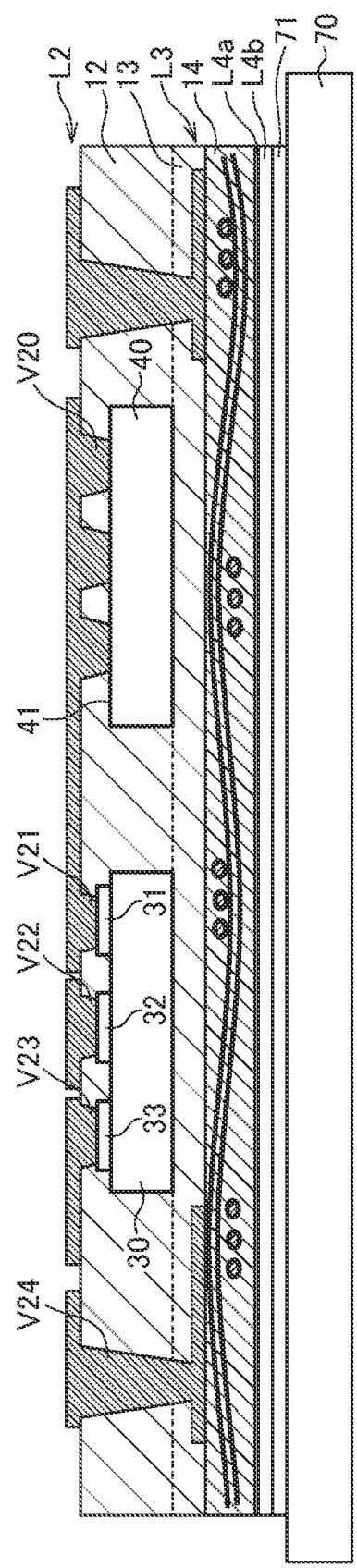
FIG. 19 is a process view for explaining the manufacturing method for the electronic component embedded substrate 1.

Then, as illustrated in FIG. 18, electroless plating and electrolytic plating are applied to form a metal film L2b on the surface of the insulating layer 12 and to form the via conductors V20 to V24 inside the via holes 80 to 82. As a result, the via conductor V20 contacts the surface 41 of the heat transfer block 40, the via conductors V21 and V22 contact the signal terminals 31 and 32 of the electronic component 30, respectively, the via conductor V23 contacts the power supply terminal 33 of the electronic component 30, and the via conductor V24 contacts the wiring layer L3. After that, as illustrated in FIG. 19, the metal film L2b is patterned using a photolithography method or the like to form the wiring layer L2.

Figure 20:
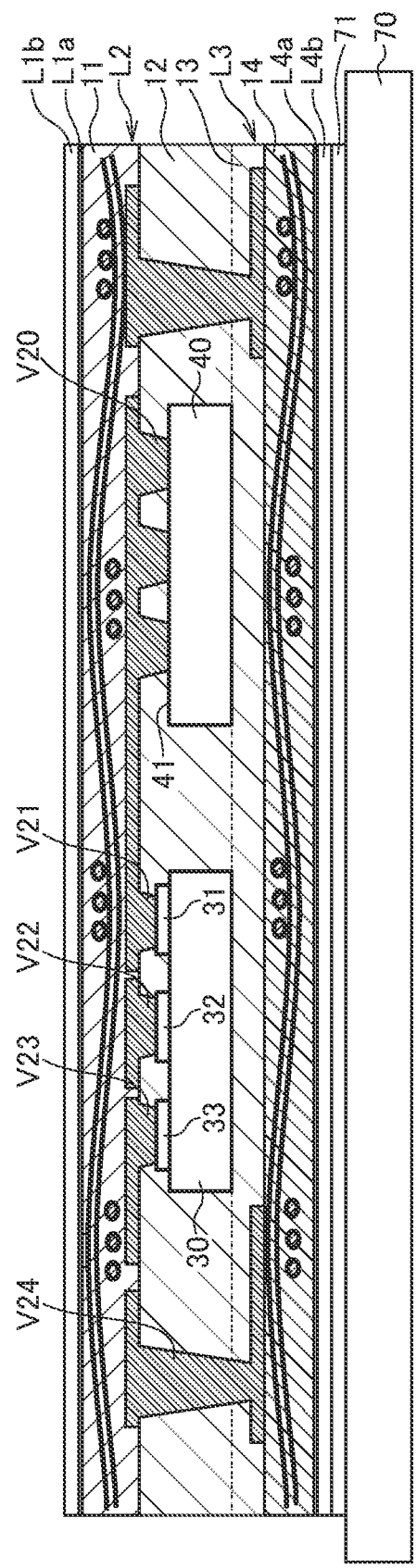
FIG. 20 is a process view for explaining the manufacturing method for the electronic component embedded substrate 1.
Figure 21:
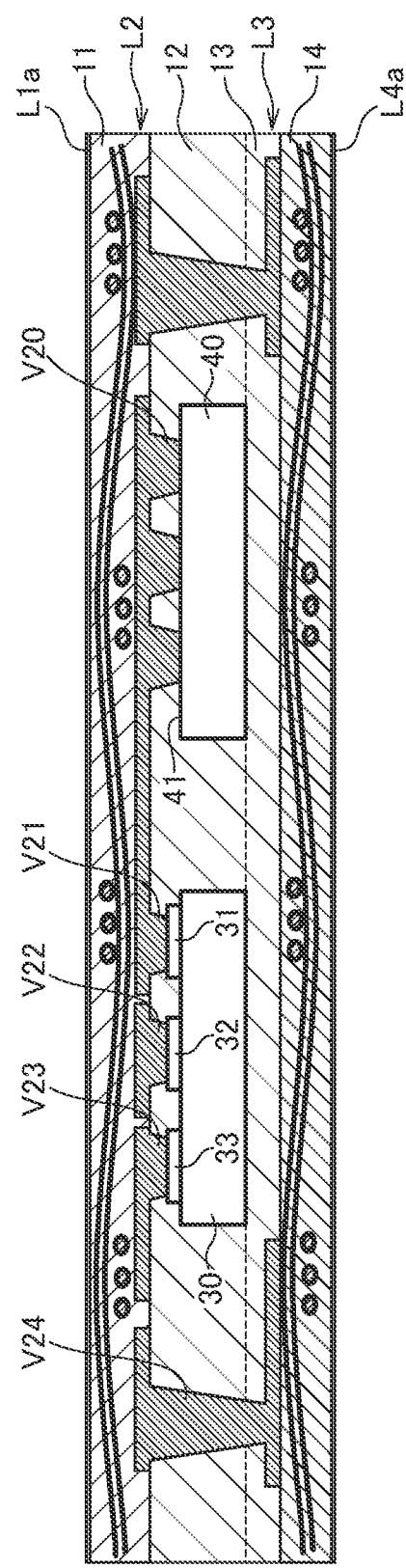
FIG. 21 is a process view for explaining the manufacturing method for the electronic component embedded substrate 1.

Then, as illustrated in FIG. 20, a sheet having the insulating layer 11 and metal films L1a and L1b laminated thereon is hot-pressed under vacuum so as to embed therein the wiring layer L2. The material and thickness of the insulating layer 11 may be the same as those of the insulating layer 14. Then, as illustrated in FIG. 21, the metal film L1b is peeled off at the boundary between the metal films L1a and L1b, and the metal film L4b is peeled off at the boundary between the metal films L4a and L4b to separate the substrate from the support member 70.

Figure 22:
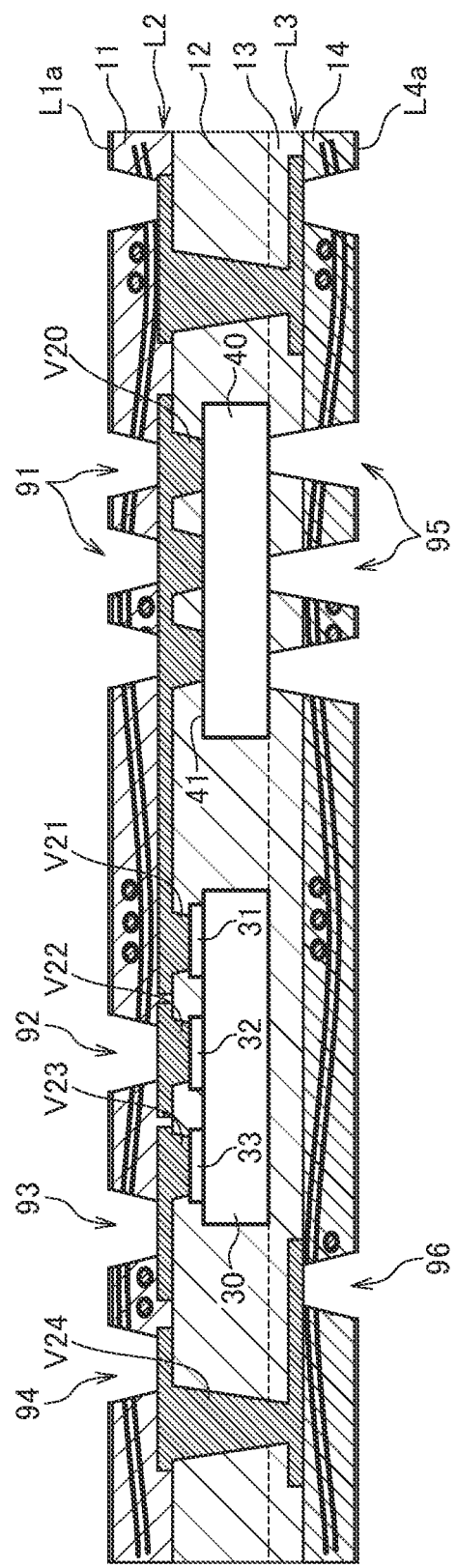
FIG. 22 is a process view for explaining the manufacturing method for the electronic component embedded substrate 1.

Then, as illustrated in FIG. 22, a part of the metal film L1a and a part of the metal film L4a are etching-removed by using a known method such as a photolithography method, and then known blasting or laser processing is applied to predetermined positions where the metal films L1a and L4a are removed to form via holes 91 to 94 in the insulating layer 11 and to form via holes 95 and 96 in the insulating layer 14. The via holes 91 to 94 penetrate the insulating layer 11 and expose the wiring patterns P21 to P24, respectively, at their bottoms. The via hole 95 penetrates the insulating layers 14 and 13 and exposes the surface 42 of the heat transfer block 40 at its bottom. The via hole 96 penetrates the insulating layer 14 and exposes the wiring pattern P34 at its bottom.

Figure 23:
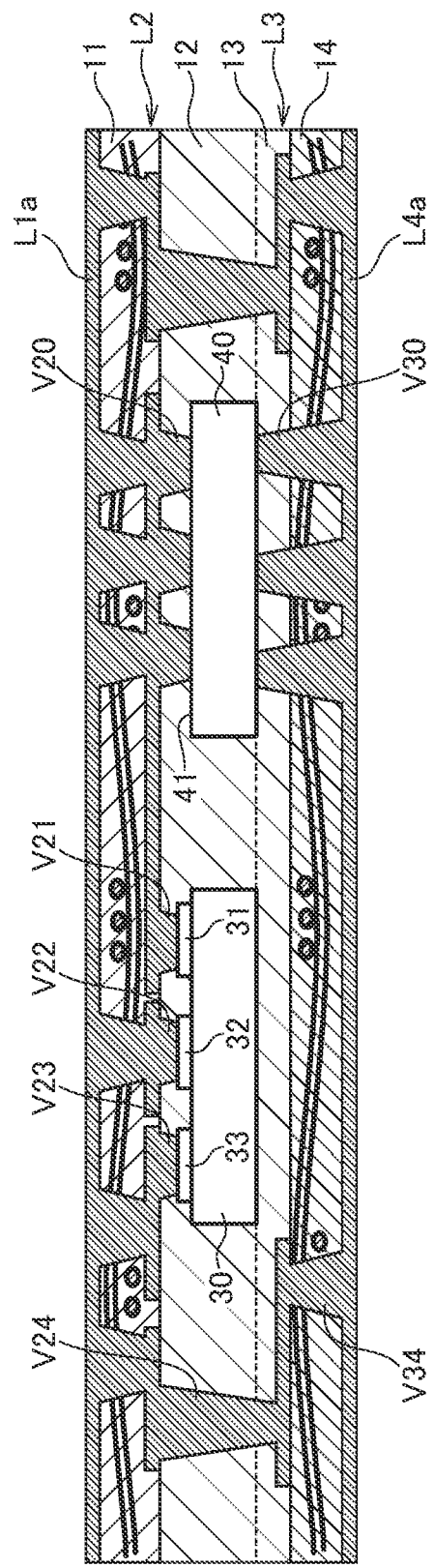
FIG. 23 is a process view for explaining the manufacturing method for the electronic component embedded substrate 1.
Figure 24:
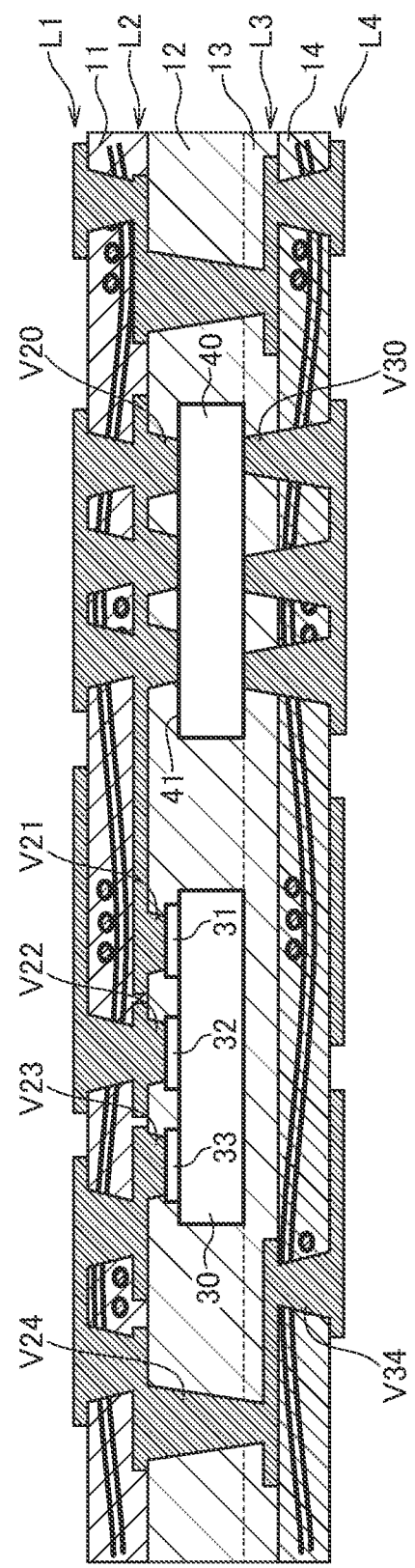
FIG. 24 is a process view for explaining the manufacturing method for the electronic component embedded substrate 1.

Then, as illustrated in FIG. 23, electroless plating and electrolytic plating are applied to form metal films L1c and L4c on the surfaces of the insulating layers 11 and 14, respectively, and to form the via conductors V11 to V14, V30, and V34 inside the via holes 91 to 96, respectively. As a result, the via conductors V11 to V14 contact the wiring patterns P11 to P14, respectively, the via conductor V30 contacts the surface 42 of the heat transfer block 40, and the via conductor V34 contacts the wiring pattern P34. After that, as illustrated in FIG. 24, the metal films L1c and L4c are patterned using a photolithography method or the like to form the wiring layers L1 and L4.

Figure 25:
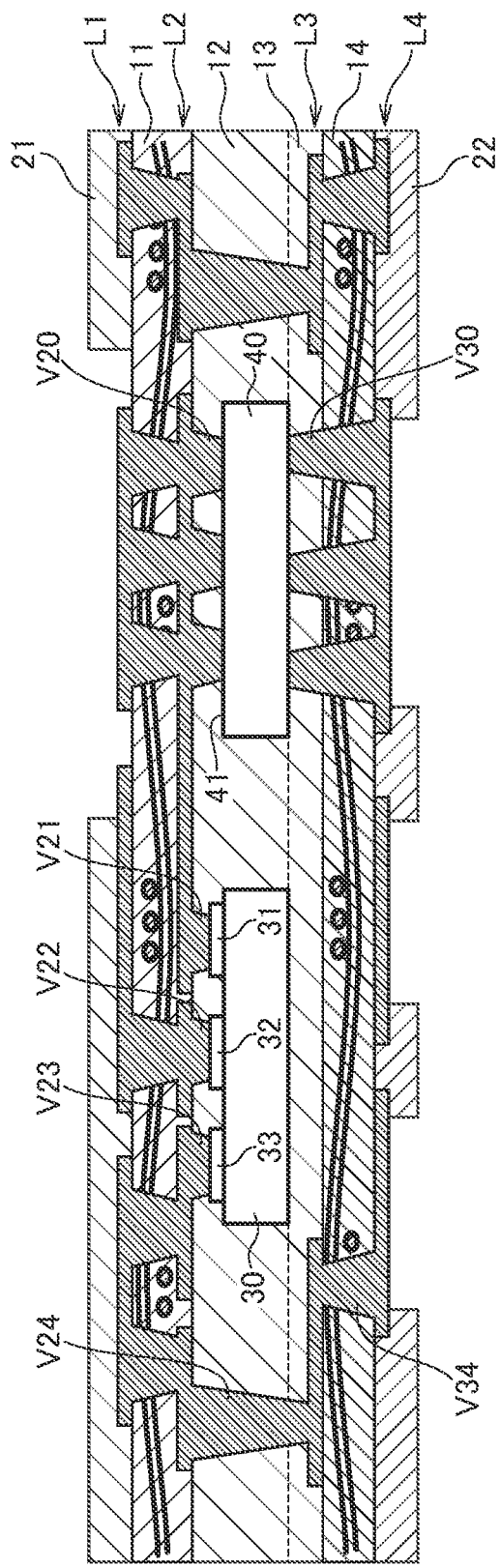
FIG. 25 is a process view for explaining the manufacturing method for the electronic component embedded substrate 1.

Then, as illustrated in FIG. 25, the solder resists 21 and 22 are formed on the surfaces of the insulating layers 11 and 14, respectively, and surface treatment for component mounting is applied to the wiring patterns P11, P12, P41, and P44 which are exposed from the solder resists 21 and 22 to form the ENEPIG coating 19, whereby the electronic component embedded substrate 1 illustrated in FIG. 1 is completed.

Figure 26:
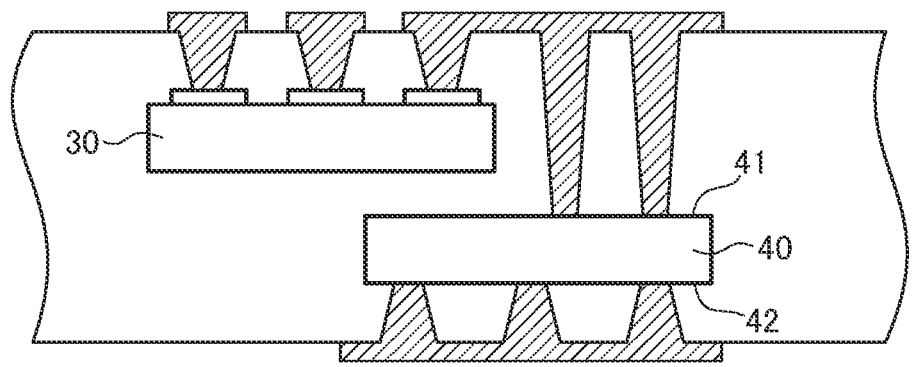
FIG. 26 is a schematic diagram for explaining a first example in which an electronic component 30 and a heat transfer block 40 are positioned at mutually different layers.
Figure 27:
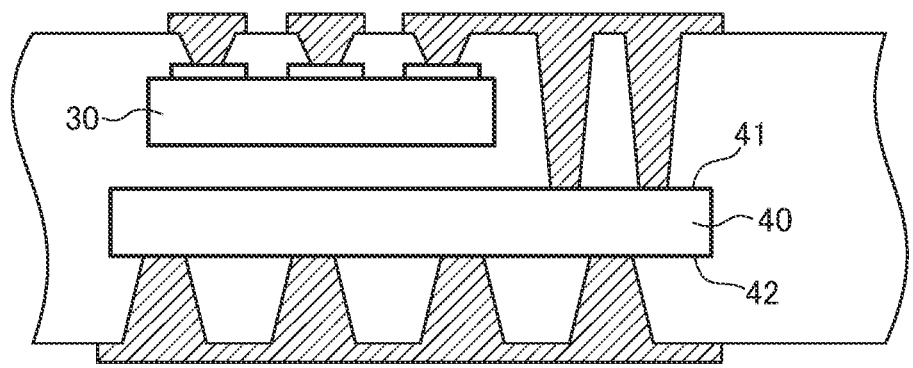
FIG. 27 is a schematic diagram for explaining a second example in which an electronic component 30 and a heat transfer block 40 are positioned at mutually different layers.

Although the electronic component 30 and heat transfer block 40 are embedded in the same layer in the above embodiment, this is not essential in the present invention, and they may be embedded in mutually different layers. In this case, the electronic component 30 and heat transfer block 40 may partly overlap each other in a plan view as illustrated in FIG. 26, or the whole part of the electronic component 30 may overlap a part of the heat transfer block 40 in a plan view as illustrated in FIG. 27.

It is apparent that the present invention is not limited to the above embodiments, but may be modified and changed without departing from the scope and spirit of the invention.

For example, in the above embodiment, the signal terminal 51 of the electronic component 50 mounted on the electronic component embedded substrate 1 is positioned on the back surface side of the electronic component 50, and the signal terminal 52 is positioned on the upper surface side; however, the electronic component to be mounted on the electronic component embedded substrate 1 may not necessarily have such a configuration, but both of the signal terminals may be positioned together on the upper surface side or lower surface side.

Further, the number of the heat transfer blocks to be embedded the substrate 10 is not limited to one, but a plurality of the heat transfer blocks may be embedded in the substrate 10.

REFERENCE SIGNS LIST 1 electronic component embedded substrate
2 circuit module
3 motherboard
10 substrate
10a upper surface of substrate
10b back surface of substrate
11-14 insulating layer
19 ENEPIG coating
21, 22 solder resist
30 electronic component
31, 32 signal terminal
33 power supply terminal
40, 40A-40H heat transfer block
41, 42 surface of heat transfer block
43, 44 silicon substrate
45, 45a insulating film
46, 46c, 46d main body part
46a, 46b addition part
47, 48 insulating film
49 ceramic
50 electronic component
51, 52 signal terminal
60, 62 solder
61 bonding wire
70 support member
71 release layer
80-82, 91-96 via hole
A electronic component mounting area
B bonding pad
G ground pattern
L1-L4 wiring layer
L1a-L1c, L2a, L2b, L3a, L4a-L4c metal film
P11-P14, P21-P24, P34, P41, P44 wiring pattern
V11-V14, V20-V24, V30, V34 via conductor

What is claimed is:

1. An electronic component embedded substrate comprising:
    a substrate including a plurality of wiring layers including at least first, second, and third wiring layers and a plurality of insulating layers including at least a first insulating layer positioned between the first and second wiring layers and a second insulating layer positioned between the first and third wiring layers, the plurality of wiring layers and the plurality of insulating layers being alternately stacked;
    a first electronic component and a heat transfer block which are embedded in the first insulating layer;
    a first wiring pattern positioned in the first wiring layer, the first wiring pattern including a first section facing one surface of the heat transfer block, a second section facing a main surface of the first electronic component, and a third section connecting the first and the second sections;
    a second wiring pattern positioned in the second wiring layer and facing an other surface of the heat transfer block;
    a third wiring pattern positioned in the third wiring layer and overlapping the first section of the first wiring pattern;
    a first via conductor connecting the first section of the first wiring pattern and the one surface of the heat transfer block;
    a second via conductor connecting the second wiring pattern and the other surface of the heat transfer block;
    a third via conductor connecting the second section of the first wiring pattern and the electronic component; and
    a fourth via conductor penetrating through the second insulating layer and connecting the third wiring pattern and the first section of the first wiring pattern,
    wherein the third wiring pattern is exposed so as to define an electronic component mounting area for mounting a second electronic component, and
    wherein the one surface and the other surface of the heat transfer block are insulated from each other, whereby the first and second wiring patterns are insulated from each other by the heat transfer block.

2. The electronic component embedded substrate as claimed in claim 1, wherein the heat transfer block comprises an SOI (Silicon On Insulator) chip.

3. A circuit module comprising:
    the electronic component embedded substrate as claimed in claim 1; and
    the second electronic component mounted in the electronic component mounting area,
    wherein the first and second electronic components are connected to each other through the first wiring pattern, the fourth via conductor, and the third wiring pattern.

4. The circuit module as claimed in claim 3, wherein the second electronic component is a laser diode or a power supply inductor.

5. The electronic component embedded substrate as claimed in claim 1, wherein the heat transfer block includes:

a first metal block having the one surface of the heat transfer block;
a second metal block having the other surface of the heat transfer block; and
an insulating film provided between the first metal block and the second metal block such that the first and second metal blocks are electrically isolated from each other.

6. The electronic component embedded substrate as claimed in claim 5,
wherein the first metal block further has a first surface opposite to the one surface of the heat transfer block,
wherein the second metal block further has a second surface opposite to the other surface of the heat transfer block, and
wherein the insulating film is in contact with the first and second surfaces.

7. The electronic component embedded substrate as claimed in claim 6,
wherein the first surface has a first recess,
wherein the second surface has a first projection, and
wherein the first recess and the first projection face each other via the insulating film.

8. The electronic component embedded substrate as claimed in claim 7,
wherein the first surface further has a second projection,
wherein the second surface further has a second recess, and
wherein the second recess and the second projection face each other via the insulating film.

9. A substrate comprising:
a first wiring layer having a first wiring pattern;
a second wiring layer having a second wiring pattern;
a third wiring layer having a third wiring pattern;
a first insulating layer positioned between the first and second wiring layers;
a second insulating layer positioned between the first and third wiring layers; and
a heat transfer block embedded in the first insulating layer,
wherein the heat transfer block includes:
    a first metal block having a first surface and a second surface opposite to the first surface;
    a second metal block having a third surface and a fourth surface opposite to the third surface; and
    an insulating film provided between the second surface and the fourth surface such that the first and second metal blocks are electrically isolated from each other,
wherein the first wiring pattern is connected to the first surface of the first metal block through a first via conductor,
wherein the second wiring pattern is connected to the third surface of the second metal block through a second via conductor,
wherein the third wiring pattern is connected to the first wiring pattern through a third via conductor penetrating through the second insulating layer,
wherein the first and second wiring patterns are insulated from each other by the insulating film of the heat transfer block,
wherein the first insulating layer is made of a resin material free from a core material, and
wherein the second insulating layer includes a resin material and a core material.

10. The substrate as claimed in claim 9, further comprising an electronic component embedded in the first insulating layer.

11. The substrate as claimed in claim 10,
wherein the electronic component has a terminal electrode, and
wherein the first wiring pattern is connected to the terminal electrode of the electronic component.

12. The substrate as claimed in claim 9,
wherein the second surface has a first recess,
wherein the fourth surface has a first projection, and
wherein the first recess and the first projection face each other via the insulating film.

13. The substrate as claimed in claim 12,
wherein the second surface further has a second projection,
wherein the fourth surface further has a second recess, and
wherein the second recess and the second projection face each other via the insulating film.

14. A substrate comprising:
a first wiring layer having a first signal pattern;
a second wiring layer having a ground pattern isolated from the first signal pattern;
a first insulating layer positioned between the first and second wiring layers; and
an electronic component and a heat transfer block embedded in the first insulating layer,
wherein the electronic component has a signal electrode,
wherein the heat transfer block includes a first surface and a second surface opposite to the first surface,
wherein the first surface and the second surface are electrically isolated from each other,
wherein the first signal pattern includes a first section overlapping the first surface of the heat transfer block, a second section overlapping the signal electrode of the electronic component, and a third section connecting the first and second sections,
wherein the second section of the first signal pattern is connected to the signal electrode of the electronic component through a first via conductor,
wherein the first section of the first signal pattern is connected to the first surface of the heat transfer block through a plurality of second via conductors,
wherein the ground pattern is connected to the second surface of the heat transfer block through a plurality of third via conductors, and
wherein the first signal pattern and the ground pattern are insulated from each other by the heat transfer block.

15. The substrate as claimed in claim 14, wherein the electronic component is isolated from the ground pattern.

16. The substrate as claimed in claim 14, wherein the heat transfer block includes:
a first metal block having the first surface;
a second metal block having the second surface; and
an insulating film provided between the first and second metal blocks such that the first and second metal blocks are electrically isolated from each other.

17. The substrate as claimed in claim 14, further comprising:
a third wiring layer having a second signal pattern; and
a second insulating layer positioned between the first and third wiring layers,
wherein the signal pattern is sandwiched between the first and second insulating layers, and
wherein the first section of the first signal pattern is connected to the second signal pattern through a plurality of fourth via conductors penetrating through the second insulating layer.

18. The electronic component embedded substrate as claimed in claim 1, further comprising:

a fourth wiring pattern positioned in the first wiring layer and facing the main surface of the first electronic component;

a fifth wiring pattern positioned in the third wiring layer;

a fifth via conductor connecting the fourth wiring pattern and the electronic component; and a sixth via conductor penetrating through the second insulating layer and connecting the fifth wiring pattern and the fourth wiring pattern, wherein a part of the fifth wiring pattern is exposed so as to define a bonding pad.

19. The electronic component embedded substrate as claimed in claim 18, wherein the bonding pad is smaller in size than the electronic component mounting area.

20. The electronic component embedded substrate as claimed in claim 1, wherein the plurality of wiring layers further includes a fourth wiring layer, wherein the plurality of insulating layers further includes a third insulating layer positioned between the second and fourth wiring layers, wherein the first insulating layer is positioned between the first and fourth wiring layers, wherein the first insulating layer is made of a resin material free from a core material, and wherein each of the second and third insulating layers includes a resin material and a core material.

\* \* \* \* \*